US006814814B2

(12) United States Patent
Collins et al.

(10) Patent No.: US 6,814,814 B2
(45) Date of Patent: Nov. 9, 2004

(54) CLEANING RESIDUES FROM SURFACES IN A CHAMBER BY SPUTTERING SACRIFICIAL SUBSTRATES

(75) Inventors: Alan W. Collins, San Francisco, CA (US); Feng Gao, Fremont, CA (US); Tetsuya Ishikawa, Santa Clara, CA (US); Padmanaban Krishnaraj, San Francisco, CA (US); Yaxin Wang, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 250 days.

(21) Appl. No.: 10/109,736

(22) Filed: Mar. 29, 2002

(65) Prior Publication Data

US 2003/0183243 A1 Oct. 2, 2003

(51) Int. Cl.[7] ................................................. B08B 3/12
(52) U.S. Cl. ........................ 134/1; 134/1.1; 134/22.1; 134/22; 134/30; 134/56 R; 134/95.1; 134/166 R; 216/37; 216/67; 216/71; 438/714; 438/905; 438/906
(58) Field of Search ............................ 134/1, 1.1, 22.1, 134/22.18, 30, 56 R, 95.1, 166; 216/37, 67, 71; 438/714, 905, 906

(56) References Cited

U.S. PATENT DOCUMENTS

| 5,207,836 A | 5/1993 | Chang |
| 5,486,975 A | 1/1996 | Shamouilian et al. |
| 5,685,916 A * | 11/1997 | Ye et al. ...................... 134/1.1 |
| 6,014,979 A | 1/2000 | Van Autryve et al. |
| 6,090,718 A | 7/2000 | Soga et al. |
| 6,136,211 A | 10/2000 | Qian et al. |
| 6,187,151 B1 * | 2/2001 | Leiphart .................. 204/192.3 |
| 6,322,714 B1 | 11/2001 | Nallan et al. |

FOREIGN PATENT DOCUMENTS

| JP | 1253238 A2 | 10/1989 |
| JP | 4165075 A2 | 6/1992 |
| JP | 9320963 A2 | 12/1997 |

* cited by examiner

*Primary Examiner*—Michael Barr
*Assistant Examiner*—Gentle E. Winter
(74) *Attorney, Agent, or Firm*—Janah & Associates (57) ABSTRACT

In a method of cleaning process residues formed on surfaces in a substrate processing chamber, a sacrificial substrate comprising a sacrificial material is placed in the chamber, a sputtering gas is introduced into the chamber, and the sputtering gas is energized to sputter the sacrificial material from the substrate. The sputtered sacrificial material reacts with residues on the chamber surfaces to clean them. In one version, the sacrificial substrate comprises a silicon-containing material that when sputtered deposits silicon on the chamber walls that reacts with and cleans fluorine-containing species that are left behind by a chamber cleaning process.

14 Claims, 4 Drawing Sheets

CLEANING RESIDUES FROM SURFACES IN A CHAMBER BY SPUTTERING SACRIFICIAL SUBSTRATES

BACKGROUND

The present invention relates to the cleaning of residues from surfaces in a substrate processing chamber.

In the fabrication of electronic circuits and displays, semiconductor, dielectric, and conductor materials, such as for example, polysilicon, silicon dioxide, aluminum or tungsten silicide, are formed on a substrate by, for example, chemical vapor deposition (CVD), physical vapor deposition (PVD), oxidation and nitridation processes. In CVD processes, a reactive gas is used to deposit material on the substrate, and in PVD processes, a target is sputtered to deposit material on the substrate. In oxidation and nitridation processes, an oxide or nitride material, for example, silicon dioxide or silicon nitride, respectively, is formed on the substrate by exposing the substrate to a suitable gaseous environment. In subsequent processes, a patterned mask of photoresist or hard mask is formed on the substrate by photolithographic methods, and the exposed portions of the substrate are etched by an energized gas to form patterns of gates, vias, contact holes or interconnect lines.

In such processes, process residues may deposit on the surfaces of walls and other components in the chamber. The composition of the process residues may depend upon the composition of the process gas, the material being deposited or etched, and the composition of material on the substrate. These residues are periodically cleaned off the chamber surfaces to reduce or prevent contamination of the substrate. The chamber may be cleaned by a wet-cleaning process in which the chamber is shut down and an operator scrubs or wipes the chamber walls with an acid or solvent. The chamber may also be cleaned by a dry-cleaning process in which plasma or microwave-activated cleaning gas is provided in the chamber. However, some cleaning processes are slow at cleaning certain types of process residues, for example, residues which are relatively thick or which may have a chemical composition that is hard to clean. In addition, the cleaning processes can leave behind other residues, for example, that may be generated by the adsorption of the cleaning gas onto the chamber surfaces. For example, when the cleaning gases comprises fluorine-containing species, such as a $CF_4$ or $NF_3$ gas, the fluorine-containing species may be adsorbed onto the chamber surfaces. These adsorbed species can react can adversely affect the quality of subsequent processes performed in the chamber.

Thus, it is desirable to effectively clean residues formed on surfaces in a substrate processing chamber. It is further desirable to have a cleaning process which does not require shutting down of the chamber. It is further desirable to be able to remove residues that are left behind or generated by the cleaning processes itself.

SUMMARY

A method of cleaning residues on surfaces in a chamber having process electrodes, the method comprising:
(a) placing in the chamber, a sacrificial substrate comprising a sacrificial material;
(b) introducing a sputtering gas into the chamber; and
(c) energizing the sputtering gas by applying a voltage to the process electrodes at a power level of at least about 500 watts to sputter sacrificial material from the substrate that reacts with and cleans the residues on the surfaces in the chamber.

A substrate processing chamber comprising:
a substrate transport capable of transporting a sacrificial substrate into the chamber, the sacrificial substrate comprising a sacrificial material;
a gas supply capable of providing a sputtering gas in the chamber;
a plasma generator comprising process electrodes that are capable of energizing the sputtering gas;
an exhaust capable of exhausting the sputtering gas; and
a controller adapted to control the substrate transport, gas supply, plasma generator, and exhaust, to:
(i) transport a sacrificial substrate into the chamber,
(ii) provide a sputtering gas in the chamber, and
(iii) energize the sputtering gas by controlling the plasma generator to apply a biasing voltage to the process electrodes at a power level of at least about 500 watts to sputter sacrificial material from the substrate to clean process residues from surfaces in the chamber.

A method of processing substrates in a chamber having process electrodes, the method comprising:
(a) processing one or more production substrates in the chamber by providing a substrate in the chamber, introducing a process gas in the chamber, and energizing the process gas, thereby forming process residues on the surfaces in the chamber;
(b) cleaning the process residues from the surfaces in the chamber by providing in the chamber, an energized cleaning gas comprising fluorine-containing species to clean the process residues, whereby cleaning residues comprising fluorine-containing species are formed on the surfaces in the chamber; and
(c) cleaning the cleaning residues by transporting into the chamber, a substrate comprising a silicon-containing material, introducing a sputtering gas into the chamber, and energizing the sputtering gas to sputter silicon-containing material from the substrate that is capable of reacting with the cleaning residues comprising the fluorine-containing species to form volatile compounds.

A substrate processing chamber comprising:
a substrate transport capable of transporting a substrate into the chamber;
a gas supply capable of providing a gas in the chamber;
a plasma generator comprising process electrodes capable of energizing the gas;
an exhaust capable of exhausting the gas; and
a controller adapted to control the substrate transport, gas supply, plasma generator, and exhaust, to:
(i) process one or more production substrates in the chamber by transporting the production substrates into the chamber, providing a process gas in the chamber, and energizing the process gas, thereby forming process residues on surfaces in the chamber,
(ii) clean the process residues from the surfaces in the chamber by providing in the chamber, an energized cleaning gas comprising fluorine-containing species that cleans the process residues, whereby cleaning residues comprising fluorine-containing species are formed on the surfaces in the chamber; and
(iii) clean the cleaning residues by transporting into the chamber, a substrate comprising a silicon-containing material, introducing a sputtering gas into the chamber, and energizing the sputtering gas to sputter silicon-containing material from the substrate that is capable of reacting with the cleaning residues comprising the fluorine-containing species to form volatile compounds.

DRAWINGS

These and other features, aspects, and advantages of the present invention will be better understood from the following drawings, description and appended claims, which illustrate exemplary features of the invention, however, it is to be understood that each of the features may be used in the invention in general, not merely in the context of the particular drawings, and the invention includes any combination of these features, where:

DESCRIPTION

Figure 1:
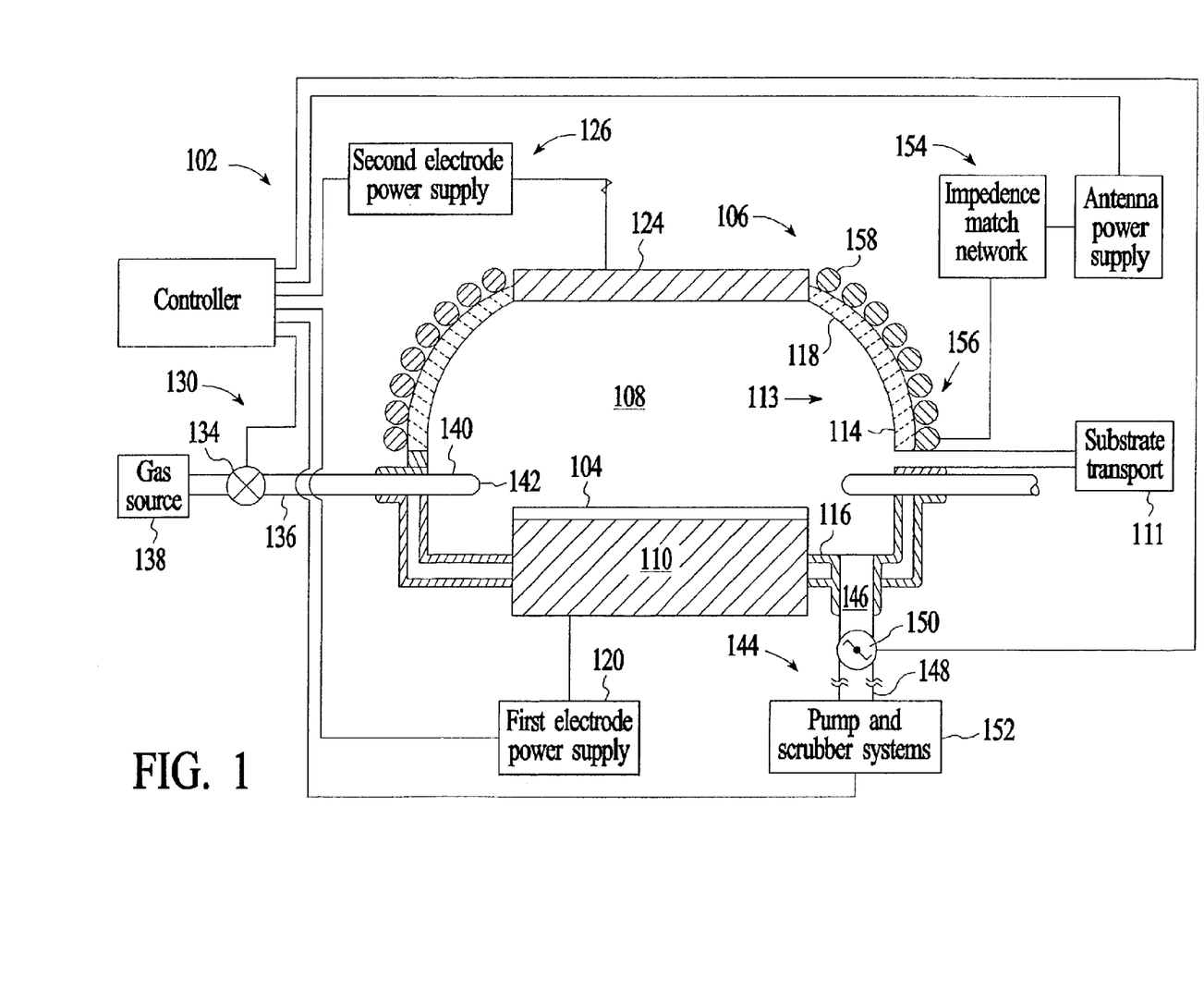
FIG. 1 is a sectional schematic view of an embodiment of an apparatus according to the present invention.

An exemplary embodiment of an apparatus 102 suitable for processing a substrate 104 is schematically illustrated in FIG. 1. The substrate 104 may comprise a production substrate, such as for example a semiconductor wafer or a flat panel display; a test substrate; or a sacrificial substrate. The apparatus 102 comprises a process chamber 106 that defines a process zone 108 for processing of a substrate 104. The substrate 104 is transported into the chamber 106 by a substrate transport 111, such as for example a robotic arm. The substrate 104 is typically held in the process zone 108 on a substrate support 110, which may include an electrostatic chuck (not shown) that is chargeable to electrostatically hold the substrate 104. The chamber 106 has chamber surfaces 113, such as sidewalls 114, a bottom wall 116, and a ceiling 118 comprising a top portion 124 facing the substrate 104. The substrate support 110 may serve as a first electrode and is connected to a first electrode power supply 120. The top portion 124 of the ceiling 118 may serve as a second electrode which is electrically biased by a second electrode power supply 126. The chamber 106 may be fabricated from any of a variety of materials including metals, ceramics, glasses, polymers and composite materials. For example, metals commonly used to fabricate the chamber 106 include aluminum, anodized aluminum, "HAYNES 242," "Al-6061," "SS 304," "SS 316," and INCONEL, of which anodized aluminum is used to fabricated a preferred version. The ceiling 118 comprises a flat, rectangular, arcuate, conical, dome or multiradius-arcuate shape as shown in FIG. 1. The particular embodiment of the apparatus 102 shown herein is suitable for processing of active and passive electronic circuitry on a substrate 104, and is provided only to illustrate the invention, and should not be used to limit the scope of the invention.

Gas comprising, for example, deposition gas, cleaning gas or sputtering gas, is introduced into the chamber 106 by a gas supply 130 comprising gas feed conduits 136 to transport the gas from the gas source 138 to the gas distributor 140 in the chamber 106, and gas flow meters 134, to regulate the flow of the gas. The gas distributor 140 comprises gas outlets 142 which may be located peripherally around the substrate 104 or near the ceiling 118 of the chamber 106 (not shown). The process gas introduced in the chamber 106 is exhausted by an exhaust 144 that includes an exhaust conduit 146, an exhaust line 148, a throttle valve 150, and pumps and scrubber systems 152 which may include roughing and turbo-molecular pumps. The exhaust conduit 146 is a port or channel that receives the gas provided in the chamber 106 for exhausting the gas, and that is typically positioned around the periphery of the substrate 104. The exhaust line 148 connects the exhaust conduit 146 to the pump and scrubber systems 152, and the throttle valve 150 in the exhaust line 148 may be used to control the pressure of gas in the chamber 106.

A plasma is formed from the gas introduced into the chamber 106 by a plasma generator 154 that energizes the gas by coupling electromagnetic energy to the gas in the process zone 108 of the chamber 106. One type of plasma generator 154 is an inductor antenna 156 comprising one or more inductor coils 158 covering the ceiling 118 of the chamber 106. In one version, the coils 158 may have a circular symmetry about a central axis of the chamber 106, the arrangement and number of the coils 158 being selected to provide the desired product of current and antenna turns (d/dt)(N·I) near the ceiling 118 to provide a good inductive flux into the plasma. In this version, the ceiling 118 may be made of a dielectric material that is permeable to electromagnetic energy, such as RF energy, for example, silicon or silicon dioxide. Another type of plasma generator 154 which is used to sputter the substrates comprises first and second process electrodes 110, 124 which are biased by the first and second electrode power supplies 120, 126 to capacitively couple electromagnetic energy to the gas in the process zone 108 of the chamber 106.

The process chamber 106 may be used as a deposition chamber to deposit material on a production substrate 104, for example, to deposit a silicon-containing material, such as polysilicon, silicon nitride, silicon oxide or metal silicide; to deposit a metal-containing material, such as aluminum or copper; or to deposit any other material on the production substrate 104. In the deposition process, a deposition gas may be introduced into the chamber 106 via the gas supply 130 to process the substrate 104. A plasma may be formed from the deposition gas by energizing the plasma generator 154 to deposit a material on the production substrate 104. For example, an insulator or dielectric material, such as for example, $SiO_2$ or $Si_3N_4$, may be deposited using a deposition gas comprising one or more of $SiH_4$, $SiClH_2$, $CO_2$, $H_2$, $N_2O$, $Si(OC_2H_5)_4$, $NH_3$ and $N_2$. Alternatively, a metal-containing material which may comprise an elemental metal, metal compound or a metal alloy, may also be deposited in the chamber 106. For example, a tungsten-containing material may be deposited using a deposition gas comprising one or more of $WF_6$, $H_2$ and $SiH_4$; a molybdenum-containing material may be deposited using, for example, deposition gas comprising $MoCl_5$ and $H_2$; and an aluminum-containing material may be deposited using, for example, deposition gas comprising $AlCl_3$ or $Al(CH_3)_3$ mixed with Ar or $H_2$ or both. Thereafter, the substrate 104 is removed and another substrate 104 may be provided in the chamber 106 for processing.

In the processing of the production substrates 104, process residues such as deposition residues form on the inner surfaces 113 of the chamber 106. After a single production substrate 104 or a batch of production substrates 104 are processed in the chamber 106, a cleaning gas is passed into the chamber 106 to clean the residues that may have formed on the internal chamber surfaces 113 during the process. The chamber surfaces 113 include, for example, a surface of one of the chamber walls 114, 116, or ceiling 118, or the surface of a component in the chamber 106, such as for example, a surface of the support 110. The cleaning gas may comprise, for example, a fluorine-containing gas, such as one or more of $NF_3$, $C_2F_6$, $C_3F_8$, $CF_4$ and $SF_6$, provided in a ratio of gas flow rate to chamber volume equivalent to at least about 1:20. The cleaning gas may energized by electromagnetic energy provided by, for example, the plasma generator 154, to form gaseous cleaning species, such as atomic fluorine, that at least partially clean the residues deposited on surfaces in the chamber 106.

The cleaning gas is energized at a power level sufficiently high to efficiently clean the deposition residues while minimizing erosion of the chamber 106. The cleaning gas may be energized by electromagnetic energy provided by, for example, the plasma generator 154, which couples electromagnetic energy, either inductively or capacitively, to the cleaning gas provided in the chamber 106. The cleaning gas is typically energized by applying RF energy to the process electrodes 110, 124 at a power level of from about 2000 to about 3500 Watts. In another version, the cleaning gas is energized in a remote chamber (not shown) by microwaves before the energized cleaning gas is introduced into the chamber 160 from the remote chamber.

Although the energized cleaning gas at least partially cleans process residues from the chamber surfaces 113, the cleaning gas may also react with the gaseous species in the chamber 106, process residues, or the chamber surfaces 113, to form cleaning residues on the inner surfaces of the chamber 106. For example, cleaning gas comprising a fluorine species may react with the surfaces of the chamber 106 which comprise aluminum to create cleaning residues composed of aluminum fluoride. Fluorine containing cleaning gases provided in ceramic containing chambers 106 may also react with the ceramic walls of the chambers 106, for example, aluminum oxide, silicon dioxide or silicon walls, to form cleaning residues comprising fluorosilicate or aluminum oxy fluoride which are difficult to clean. These cleaning residues are undesirable, as they may interfere with the efficient functioning of the chamber 106 by flaking off and falling on the production substrate 104, or by altering the chemical composition of the gases used for subsequent processing steps in the chamber 106, for example, by reacting with the gases.

The process residues, such as the deposition residues, cleaning residues or other residues, for example, residues formed in etching processes, are cleaned by a sputter cleaning step comprising sputtering one or more sacrificial substrates 104 comprising sacrificial material in the chamber 106. In the sputter cleaning process, a sacrificial substrate 104 comprising sacrificial material is placed on the support 110 in the chamber 106. The sacrificial substrate 104 may comprise a sacrificial material on the upper surface of the substrate 104 or the entire substrate 104 may be made from the sacrificial material. The sacrificial material is selected so that sputtered sacrificial species may facilitate removal of the process residues formed on the chamber surfaces 113. The sacrificial material may comprise metals, ceramics, glasses or polymers, and may include an elemental, compound, or composite form of these materials. In one embodiment, the sacrificial material may comprise a silicon-containing material, such as silicon or silicon dioxide. A sacrificial substrate 104 suitable to clean fluorine containing process residues that are formed on the chamber surfaces 113, comprises a layer of sacrificial silicon oxide having a thickness of from about 1 to about 5 $\mu$m.

After the sacrificial substrate 104 is placed in the chamber 106, a sputtering gas is provided in the chamber 106 by the gas supply 130. The sputtering gas is a gas that may be energized to sputter material off the substrate 104. For example, the sputtering gas may comprise an inert gas, such as for example, argon and xenon. The sputtering gas may also comprise a reactive gas that may react with the sputtered species or the process residues to form volatile gaseous components that may be exhausted from the chamber 106. For example, the sputtering gas may comprise an oxygen-containing gas, such as for example $O_2$ or $O_3$. A suitable sputtering gas for sputtering material from a silicon-containing sacrificial substrate 104 to remove process residues comprising aluminum fluoride, comprises argon and $O_2$ in a volumetric flow ratio of from about 0.5:1 to about 1:0.5, and even about 1:1; for example $O_2$ at a flow rate of from about 75 to about 150 sccm and argon at a flow rate of from about 75 to about 150 sccm.

The sputtering gas is energized by the plasma generator 154 which couples electrical energy to the sputtering gas to form a plasma. In one version, the sputtering gas is energized by powering the inductor antenna 156 with RF energy to inductively couple energy to the sputtering gas; by powering the support 110 supporting the substrate 104 in the chamber 106 and by electrically grounding the top portion 124 of the chamber 106 to capacitively couple electrical energy through the substrate 104 to the sputtering gas in the chamber 106. The coupled electrical energy ionizes the sputtering gas to form a sputtering plasma. The electrical energy is applied at a level that is sufficiently high to sputter the sacrificial material off the substrate 104 at a sputtering rate that provides sufficient sputtered material to react with process residues formed on the chamber surfaces 113. A suitable power level may be at least about 500 Watts, and more typically from about 1000 to about 5000 Watts. The RF energy may be applied at a frequency of to about 13.56 MHz.

In the sputter cleaning process, the energized sputtering gas bombards the sacrificial substrate 104 with energetic ions causing sacrificial material species to be sputtered off the sacrificial substrate 104. The sputtering of the sacrificial material species off the sacrificial substrate 104 is caused by collisions between the energetic ions and the surface of the sacrificial substrate 104. These collisions impart energy to the sacrificial material species, thereby dislodging them from the surface of the substrate 104. It is believed that the sputtered sacrificial species react with the process residues to form volatile species which are exhausted by the exhaust 144 or they may facilitate cleaning of the process residues by chemically altering the form of the process residues. For example, when a sputtering gas comprising argon and $O_2$ is energized to sputter silicon from a sacrificial silicon substrate 104, the energized sputtering gas, sputtered silicon, and fluorine containing process residues form volatile compounds of silicon, oxygen or fluorine, which may be exhausted from the chamber 106. For example, the sputtered silicon species and sputtering gas may react with residues comprising aluminum fluoride to form volatile species such as $SiF_4$ or $SiF_2$, which are then exhausted.

In one version of the sputter cleaning process, a number of sacrificial substrates 104 are sputtered in the chamber 106 in sequence to remove substantially all the process residues formed on the chamber surfaces 113. The number of substrates 104 sputtered in the chamber 106 may be from about 1 to about 50, and more typically from about 10 to about 40, and most typically about 24 substrates 104. Thus, the sputtering process may be repeated for about 1 to about 50 cycles before reusing the chamber 106 for another process, such as a deposition process, and more typically repeated for about 1 to about 25 cycles, and may desirably be repeated for at least about 5 cycles. Other steps may be performed in between the sputtering cycles, the intermediate steps including cleaning gas steps and test substrate steps, as described herein.

Figure 2:
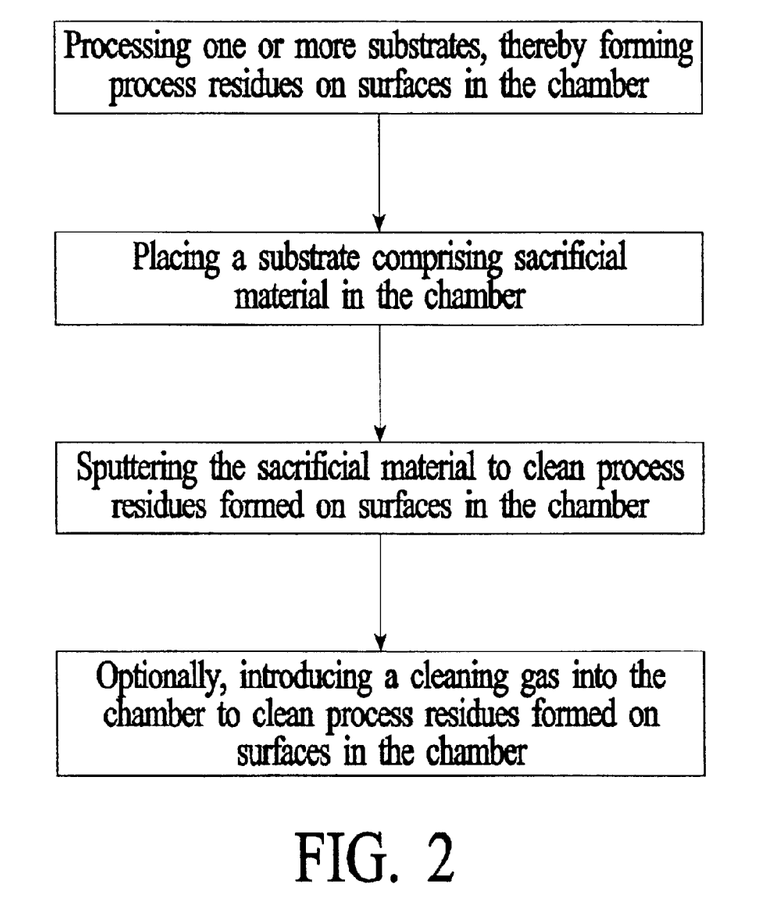
FIG. 2 is a flow chart of an embodiment of a method according to the present invention.

Optionally, any compounds or materials that may remain on the chamber surfaces 113 after the sputter cleaning process may be removed by a further dry cleaning step. For example, a suitable dry cleaning step may provide an energized cleaning gas into the chamber 106. The cleaning gas may comprise, for example, a fluorine-containing gas, such as one or more of $NF_3$, $C_2F_6$, $C_3F_8$, $CF_4$ and $SF_6$. In one embodiment, the cleaning gas comprises $NF_3$, which is introduced into the chamber 106 at a volumetric flow rate of at least about 1000 sccm, and more typically from about 1200 to about 2000 sccm, and most typically about 1500 sccm. The gas is energized at an RF power level of from about 2000 to about 3500 Watts, for at least about 50 seconds, for example, for about 120 seconds. FIG. 2 illustrates, in flow chart form, an embodiment of a method for processing a substrate 104, comprising processing one or more production substrates 104 in the chamber 106, cleaning the chamber 106 by sputtering a sacrificial substrate 104 and, optionally, introducing a cleaning gas into the chamber 106.

The cleanliness of the chamber 106, and the effectiveness of the sputter cleaning and dry cleaning processes, are determined by a testing process in which the sputtering non-uniformity of a test substrate 104 is measured. The sputtering non-uniformity of a substrate 104 is the percent relative standard deviation of the amount of a material sputtered from the test substrate 104 at different points across the surface of the substrate 104, or in other words, the standard deviation of the amount of material sputtered at each point divided by the mean and multiplied by 100. The amount of material sputtered at each point is determined by measuring the thickness of the material at the different points on the test substrate 104 both before and after sputtering, and subtracting the measured amounts. The sputtering non-uniformity of the test substrate 104 is a measure of the cleanliness of the chamber 106, as the sputtering process is affected by the amount and type of process residues on surfaces 113 in the chamber 106. Thus, by determining the sputtering non-uniformity of the test substrate 104, the cleanliness of the chamber 106 may be assessed.

Figure 3:
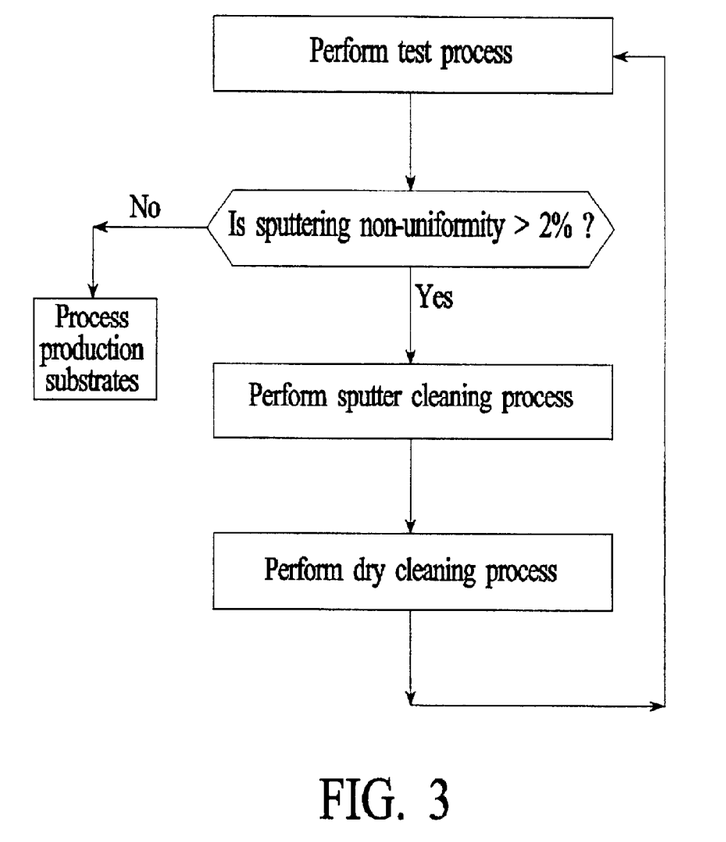
FIG. 3 is a flow chart of another embodiment of a method according to the present invention.

If the sputtering non-uniformity of a test substrate 104 processed in the testing process is too high, the chamber 106 is cleaned by the sputter cleaning and dry cleaning processes, and further testing process is performed to check the cleanliness of the chamber 106. The processes of cleaning and testing may be repeated until a desired sputtering non-uniformity value, indicating sufficient removal of process residues from surfaces 113 in the chamber 106, has been obtained. In one version, the sputter cleaning, dry cleaning, and testing processes are repeated until the sputtering non-uniformity is less than about 6% and even less than about 2.5%, and even from about 1% to about 2%. Once the desired sputtering non-uniformity value has been reached, one or more production substrates 104 may be processed in the chamber 106. FIG. 3 illustrates, in flow chart form, an embodiment of a method of cleaning a chamber comprising repeating the testing process, sputter cleaning process, and dry cleaning process, until a desired sputtering non-uniformity value is obtained.

In one version of a cleaning process, a first test substrate 104 comprising a silicon dioxide material is sputtered in the chamber 106 by introducing a sputtering gas comprising 75 sccm Ar and 75 sccm $O_2$ into the chamber 106 and energizing the sputtering gas by applying an RF power level of 4000 Watts to the inductor antenna 156 and an RF power level of 2500 to 3500 Watts to the process electrodes 110, 124. If the measured sputtering non-uniformity of the first test substrate 104 is too high, a cleaning process comprising sputter cleaning and dry cleaning processes is performed. In the sputter cleaning processes, four batches of five sacrificial substrates 104 comprising silicon material, or a total of twenty sacrificial substrates 104, are sequentially sputtered using the same process parameters as those used to sputter the first test substrate 104. Dry cleaning processes are performed between each batch by remotely energizing a cleaning gas comprising $NF_3$ and introducing the gas into the chamber 106. Once the four batches of sacrificial substrates 104 have been sputtered, and the final dry cleaning process has been completed, a final batch of four sacrificial substrates 104 comprising silicon, and a second test substrate 104 comprising silicon oxide, are sputtered in a sputter cleaning process and testing process. The final batch of substrates 104 are processed with the same process parameters as the previous sputtering processes, and the sputtering non-uniformity of the second test substrate 104 is measured. If a desired value of the sputtering non-uniformity has been obtained, then the chamber 106 has been sufficiently cleaned of process residues and the production substrates 104 may be processed. If not, the sputter cleaning, dry cleaning, and testing processes are repeated until the desired value is reached.

The cleaning process may further comprise a wet cleaning process which may be performed by exposing the surfaces of the chamber 106 to a cleaning solvent, such as de-ionized water. It is believed that reaction of hydrogen species of the de-ionized water and aluminum fluoride deposits results in the formation of HF, which may be more easily removed by cleaning of the chamber 106 with the de-ionized water. However, other solvents may be used in the wet cleaning process depending upon the composition of the process residues formed on chamber surfaces 113.

Figure 4:
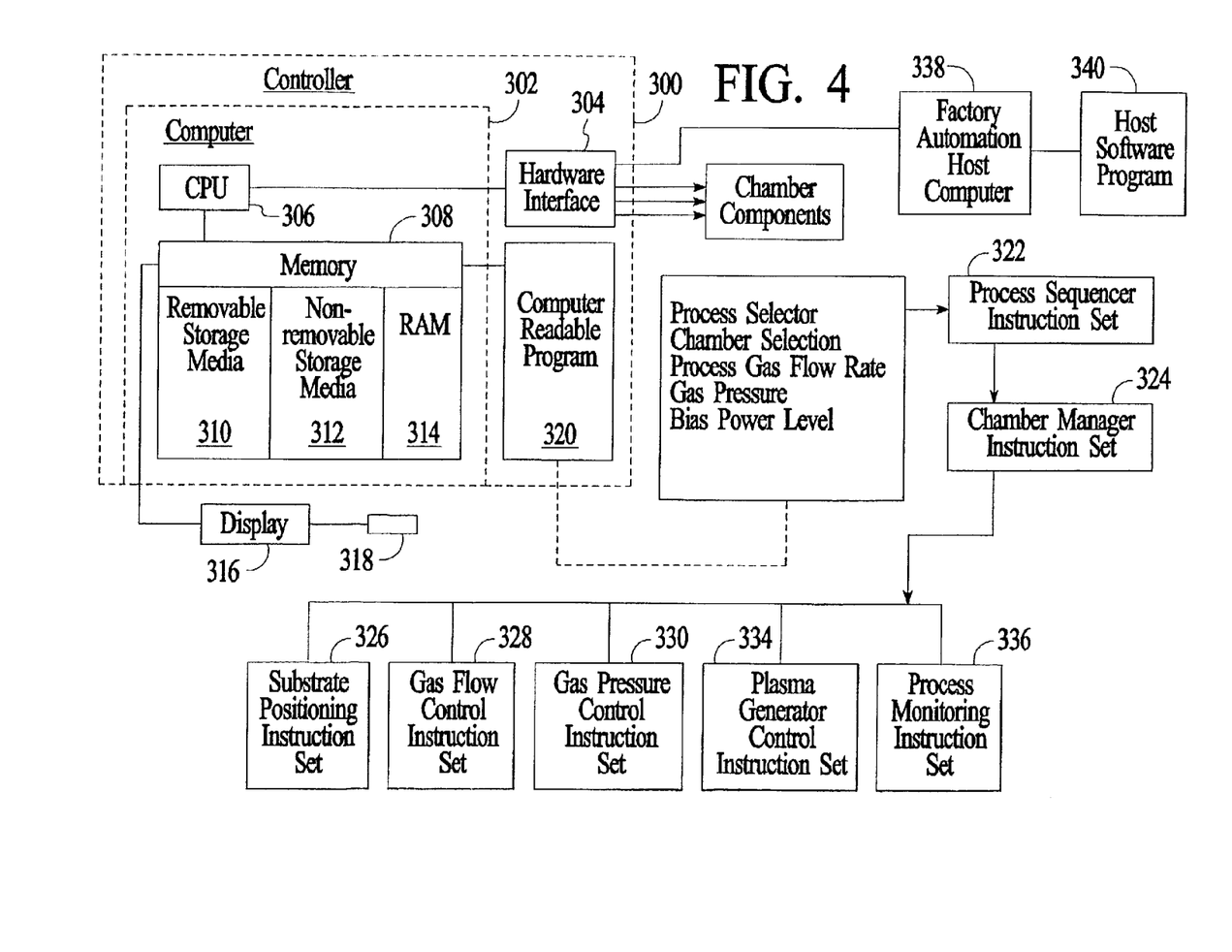
FIG. 4 is a block diagram of a controller and computer readable program.

The chamber 106 may be operated by a controller 300. The controller 300 may comprise a plurality of interface cards including, for example, analog and digital input and output boards, interface boards, such as a hardware interface board 304, and motor controller boards. The controller 300 may further comprise a computer 302 which may comprise a central processor unit (CPU) 306, such as for example a 68040 microprocessor, commercially available from Synergy Microsystems, California, or a Pentium Processor commercially available from Intel Corporation, Santa Clara, Calif., that is coupled to a memory 308 and peripheral computer components, as shown in FIG. 4. Preferably, the memory 308 may include a removable storage media 310, such as for example a CD or floppy drive, a non-removable storage media 312, such as for example a hard drive, and random access memory 314. The interface between an operator and the controller 300 can be, for example, via a display 316 and a light pen 318. The light pen 318 detects light emitted by the monitor display 316 with a light sensor in the tip of the light pen 318. To select a particular screen or function, the operator touches a designated area of a screen on the monitor 316 and pushes the button on the light pen 318. Typically, the area touched changes color, or a new menu is displayed, confirming communication between the user and the controller 300.

The computer-readable program 320 may be stored in the memory 308, for example on the non-removable storage media 312 or on the removable storage media 310. The computer readable program 320 generally comprises process control software comprising program code to operate the chamber 106 and its components, process monitoring software to monitor the processes being performed in the chamber 106, safety systems software, and other control software, as for example, illustrated in FIG. 4. The computer-readable program 320 may be written in any conventional computer-readable programming language, such as for example, assembly language, $C^{++}$, Pascal, or Fortran. Suitable program code is entered into a single file, or multiple files, using a conventional text editor and stored or embodied in computer-usable medium of the memory 308. If the entered code text is in a high level language, the code is compiled, and the resultant compiler code is then linked with an object code of precompiled library routines. To execute the linked, compiled object code, the user invokes the object code, causing the CPU 306 to read and execute the code to perform the tasks identified in the program.

An embodiment of a computer readable program 320 according to the present invention is illustrated in FIG. 4. Using a light pen interface, a user enters a process set and chamber number into the computer readable program 320 in response to menus or screens displayed on the CRT terminal. The computer readable program includes program code to control the substrate position, gas flow, gas pressure, temperature, RF power levels, and other parameters of a particular process, as well as code to monitor the chamber process. The process sets are predetermined groups of process parameters necessary to carry out specified processes. The process parameters are process conditions, including without limitations, gas composition, gas flow rates, temperature, pressure and plasma generator settings such as RF or microwave power levels.

The process sequencer instruction set 322 comprises program code to accept a chamber type and set of process parameters from the computer readable program 320 and to control its operation. The sequencer program 322 initiates execution of the process set by passing the particular process parameters to a chamber manager instruction set 324 that controls multiple processing tasks in the process chamber 106. Typically, the process chamber instruction set 324 includes a substrate positioning instruction set 326, a gas flow control instruction set 328, a gas pressure control instruction set 330, a plasma generator control instruction set 334, and a process monitoring instruction set 336. Typically, the substrate positioning instruction set 326 comprises program code for controlling chamber components that are used to load the substrate 104 onto the support 110 and optionally, to lift the substrate 104 to a desired height in the chamber 106. The gas flow control instruction set 328 comprises program code for controlling the flow rates of different constituents of the process gas. The gas flow control instruction set 328 controls the open/close position of the gas flow meter 134 to obtain the desired gas flow rate. The gas pressure control instruction set 330 comprises program code for controlling the pressure in the chamber 106 by regulating the opening size of the throttle valve 150 in the exhaust 144 of the chamber 106. The process monitoring instruction set 336 comprises code for monitoring a process in the chamber 106. Optionally, a temperature control instruction set may be used to control the temperature of the chamber components such as the sidewalls 114 or the support 110.

The plasma generator control instruction set 334 comprises program code for energizing the plasma generator 154 to couple electromagnetic energy to the process gas, cleaning gas or sputtering gas in the process zone 108 of the chamber 106. For example, the plasma generator control instruction set 334 may set the RF bias power levels applied to the process electrodes 110, 124 in the chamber 106. In one version, the plasma generator control instruction set 334 may energize the plasma generator 154 to energize a cleaning gas in the chamber 106. In another version, the plasma generator control instruction set 334 may energize the plasma generator 154 to energize a chemical vapor deposition gas to deposit material on a substrate 104. In yet another version, the plasma generator control instruction set 334 may energize the plasma generator 154 to energize a sputtering gas. In this version, the plasma generator control instruction set 334 may also control the rate at which the sacrificial material is sputtered. The rate may be controlled, for example, by setting the RF source and bias power levels applied to the inductor antenna 156 and process electrodes 110, 124, respectively. The rate may be selected to provide sufficient sputtered material to react with the process residues formed on chamber surfaces 113. In one version, the rate may be sufficiently high to clean the process residues on the chamber surfaces 113. The plasma generator control instruction set 334 may also energize the plasma generator 154 to sputter sacrificial material sequentially from a number of substrates 104. Desirably, the plasma generator 154 may be energized to sputter sacrificial material from at least about 5 substrates 104.

The data signals received by and/or evaluated by the controller 300 may be sent to a factory automation host computer 338. The factory automation host computer 318 may comprise a host software program 340 that evaluates data from several systems, platforms or chambers 106, and for batches of substrates 104 or over an extended period of time, to identify statistical process control parameters of (i) the processes conducted on the substrates 104, (ii) a property that may vary in a statistical relationship across a single substrate 104, or (iii) a property that may vary in a statistical relationship across a batch of substrates 104. The host software program 340 may also use the data for ongoing in-situ process evaluations or for the control of other process parameters. A suitable host software program comprises a WORKSTREAM™ software program available from aforementioned Applied Materials. The factory automation host computer 338 may be further adapted to provide instruction signals to (i) remove particular substrates 104 from the processing sequence, for example, if a substrate property is inadequate or does not fall within a statistically determined range of values, or if a process parameter deviates from an acceptable range; (ii) end processing in a particular chamber 106, or (iii) adjust process conditions upon a determination of an unsuitable property of the substrate 104 or process parameter. The factory automation host computer 338 may also provide instruction signals at the beginning or end of processing of the substrate 104 in response to evaluation of the data by the host software program 340.

The present invention has been described with reference to certain preferred versions thereof; however, other versions are possible. For example, the cleaning process of the present invention may be used for treating chambers for other applications, as would be apparent to one of ordinary skill. For example, the process may be applied to treat sputtering chambers, ion implantation chambers, etch chambers or other deposition chambers, or which may be applied in combination with other types of cleaning processes. Therefore, the spirit and scope of the appended claims should not be limited to the description of the preferred versions contained herein.

What is claimed is:

1. A method of cleaning residues on surfaces in a chamber having process electrodes, the method comprising:
   (a) placing in the chamber, a sacrificial substrate comprising a sacrificial material;
   (b) introducing a sputtering gas into the chamber; and
   (c) energizing the sputtering gas by applying a voltage to the process electrodes at a power level of at least about 500 Watts to sputter sacrificial material from the substrate that reacts with and cleans the residues on the surfaces in the chamber.

2. A method according to claim 1 wherein the chamber further comprises an antenna about the chamber, and the method further comprises passing a current through the antenna at a power level of at least about 500 watts.

3. A method according to claim 1 comprising repeating (a), (b) and (c) for a plurality of cycles.

4. A method according to claim 3 wherein the plurality of cycles comprises at least about 5 cycles.

5. A method according to claim 1 comprising the initial step of cleaning the chamber with a cleaning gas comprising fluorine-containing species, whereby residues comprising fluorine-containing species are formed on the surfaces in the chamber.

6. A method according to claim 5 comprising placing a sacrificial substrate comprising silicon-containing material in the chamber, whereby sputtered sacrificial material comprising silicon reacts with the residues comprising the fluorine-containing species to form volatile compounds.

7. A method of processing substrates in a chamber having process electrodes, the method comprising:
   (a) processing one or more production substrates in the chamber by providing a substrate in the chamber, introducing a process gas in the chamber, and energizing the process gas, thereby forming process residues on surfaces in the chamber;
   (b) cleaning the process residues from the surfaces in the chamber by providing in the chamber, an energized cleaning gas comprising fluorine-containing species to clean the process residues, whereby cleaning residues comprising fluorine-containing species are formed on the surfaces in the chamber; and
   (c) cleaning the cleaning residues by transporting into the chamber, a substrate comprising a silicon-containing material, introducing a sputtering gas into the chamber, and energizing the sputtering gas to sputter silicon-containing material from the substrate that is capable of reacting with the cleaning residues comprising the fluorine-containing species to form volatile compounds.

8. A method according to claim 7 wherein (c) comprises applying a biasing voltage to the process electrodes at a power level of at least about 500 Watts.

9. A method according to claim 7 wherein the chamber comprises an antenna about the chamber, and wherein (c) comprises applying a current to the antenna at a power level of at least about 500 Watts.

10. A method according to claim 7 comprising repeating (c) for a plurality of cycles.

11. A method according to claim 7 wherein the chamber comprises surfaces comprising aluminum, and wherein (c) comprises cleaning cleaning residues comprising aluminum fluoride.

12. A method according to claim 1 wherein the sputtering gas comprises argon and $O_2$ in a volumetric flow ratio of from about 0.5:1 to about 1:0.5.

13. A method according to claim 1 wherein (c) comprises applying a voltage to the process electrodes at a power level of from about 1000 Watts to about 5000 Watts.

14. A method of processing substrates in a chamber having process electrodes, the method comprising:
   (a) processing one or more production substrates in the chamber by providing a substrate in the chamber, introducing a process gas in the chamber, and energizing the process gas, thereby forming process residues on surfaces in the chamber;
   (b) cleaning the process residues from the surfaces in the chamber by providing in the chamber, an energized cleaning gas comprising fluorine-containing species to clean the process residues, whereby cleaning residues comprising fluorin-containing species are formed on the surfaces in the chamber; and
   (c) cleaning the cleaning residues by transporting into the chamber, a substrate comprising a silicon-containing material, introducing a sputtering gas into the chamber, the sputtering gas comprising argon and $O_2$ in a volumetric flow ratio of from about 0.5:1 to about 1:0, and energizing the sputtering gas by applying a voltage to the process electrodes at a power level of from about 1000 Watts to about 5000 Watts to sputter silicon-containing material from the substrate that is capable of reacting with the cleaning residues comprising the fluorine-containing species to form volatile compounds.

* * * * *